United States Patent
Teboulle et al.

(10) Patent No.: US 11,879,955 B2
(45) Date of Patent: Jan. 23, 2024

(54) VERIFYING THE METROLOGICAL ACCURACY OF AN ELECTRICITY METER

(71) Applicant: SAGEMCOM ENERGY & TELECOM SAS, Rueil Malmaison (FR)

(72) Inventors: Henri Teboulle, Rueil Malmaison (FR); Frédéric Geheniau, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 0 days.

(21) Appl. No.: 17/884,893

(22) Filed: Aug. 10, 2022

(65) Prior Publication Data
US 2023/0050196 A1 Feb. 16, 2023

(30) Foreign Application Priority Data
Aug. 10, 2021 (FR) ...................................... 2108625

(51) Int. Cl.
| | |
|---|---|
| *G01R 35/00* | (2006.01) |
| *G01K 7/16* | (2006.01) |
| *G01R 21/133* | (2006.01) |
| *G01K 7/06* | (2006.01) |

(52) U.S. Cl.
CPC .............. *G01R 35/00* (2013.01); *G01K 7/06* (2013.01); *G01R 21/133* (2013.01)

(58) Field of Classification Search
CPC ......... G01R 35/00; G01R 21/133; G01K 7/16
See application file for complete search history.

(56) References Cited

U.S. PATENT DOCUMENTS

| | | | | |
|---|---|---|---|---|
| 6,501,257 B1* | 12/2002 | Elmore | ................. | G01R 35/04 324/74 |
| 2011/0218749 A1* | 9/2011 | Bassford | .............. | G01R 21/133 324/127 |
| 2012/0050053 A1* | 3/2012 | Kim | ........................ | H02P 9/102 713/320 |
| 2015/0276830 A1* | 10/2015 | Airaksinen | .......... | G01R 22/068 324/74 |
| 2016/0282399 A1* | 9/2016 | Veroni | ................. | G01R 22/066 |
| 2017/0086281 A1* | 3/2017 | Avrahamy | ............. | H05B 47/19 |

FOREIGN PATENT DOCUMENTS

| | | |
|---|---|---|
| EP | 0092303 B1 | 10/1986 |
| EP | 2904410 B1 | 5/2019 |
| WO | WO2014027318 A1 | 2/2014 |

* cited by examiner

*Primary Examiner* — Akm Zakaria
(74) *Attorney, Agent, or Firm* — Muncy, Geissler, Olds & Lowe, P.C.

(57) ABSTRACT

An electricity meter includes a test circuit comprising a test component and a connection component arranged to place the test component in a connected configuration in which the test component is connected to the phase conductor and to the neutral conductor, and in a disconnected configuration in which the test component is disconnected from the phase conductor and/or from the neutral conductor; a processor component arranged to control the connection component in such a manner that it places the test component in the connected configuration during a predetermined test duration to measure surplus energy consumption, and to estimate measurement error of the electricity meter from the surplus energy.

19 Claims, 5 Drawing Sheets

VERIFYING THE METROLOGICAL ACCURACY OF AN ELECTRICITY METER

The invention relates to the field of electricity meters.

BACKGROUND OF THE INVENTION

Over the lifetime of an electricity meter, drift in its metrological accuracy can have the consequence of significantly over-evaluating or under-evaluating consumption of electrical energy.

Over-evaluation is penalizing for the subscriber, while under-evaluation is penalizing for the energy distributor (in particular in the event of a large number of meters suffering the same drift).

Drift in metrological accuracy is very difficult to detect when it takes place slowly and the measurements produced remain credible even though they are erroneous.

Since it would be very complicated and very burdensome to cause operators to intervene regularly and systematically to verify the metrological accuracy of all electricity meters, attempts are being made to develop meters that are capable of acting autonomously to verify their own accuracy. The meters evaluate their own metrological accuracy error, and If it does not lie within the required accuracy range, they produce an alarm message, and (for example) send it to the information system (IS) of the energy distributor.

Meters are thus known that are provided with a measurement circuit having the primary function of measuring the energy consumption of an installation, and that also performs self measurement of metrological accuracy. The measurement circuit incorporates a current generator for injecting a test current upstream from the meter.

That solution works only for low levels of phase current (i.e. current in the phase line). Furthermore, the test current is generally injected at a frequency that is different from the frequency of the distribution network, which requires filtering to separate the injected energy from the energy normally received by the meter. That solution is thus both complicated to design and also relatively burdensome.

OBJECT OF THE INVENTION

An object of the invention is to provide a solution that enables an electricity meter to estimate its own measurement error in a manner that is reliable, simple, and inexpensive, and that is suitable for use regardless of the level of phase current.

SUMMARY OF THE INVENTION

In order to achieve this object, there is provided an electricity meter arranged to measure the consumption of energy supplied to an installation by a distribution network comprising a phase line and a neutral line, the electricity meter comprising:
- a phase conductor and a neutral conductor arranged to be connected respectively to the phase line and to the neutral line;
- a test circuit comprising a test component and a connection component arranged to place the test component selectively in a connected configuration in which the test component is connected to the phase conductor and to the neutral conductor in parallel with the installation so as to form an additional load, and in a disconnected configuration in which the test component is disconnected from the phase conductor and/or from the neutral conductor;
- a processor component arranged to control the connection component in such a manner that it places the test component in the connected configuration during a predetermined test duration so as to act during the predetermined test duration to measure surplus energy consumption due to the additional load, and to estimate measurement error of the electricity meter from the surplus energy.

The measurement error evaluation performed by the electricity meter of the invention consists in diverting current to flow internally within the electricity meter by the timed addition of a controllable internal load. The electricity meter of invention thus evaluates its own measurement error without using a current generator, and without using complex filtering. The test circuit is simple to provide and inexpensive.

Measurement error evaluation is very accurate and very reliable (no false positives), and it can be undertaken regardless of the level of the phase current.

The invention can be better understood in the light of the following description of particular, nonlimiting embodiments of the invention.

BRIEF DESCRIPTION OF THE DRAWINGS

Reference is made to the accompanying drawings, in which.

DETAILED DESCRIPTION OF THE INVENTION

Figure 1:
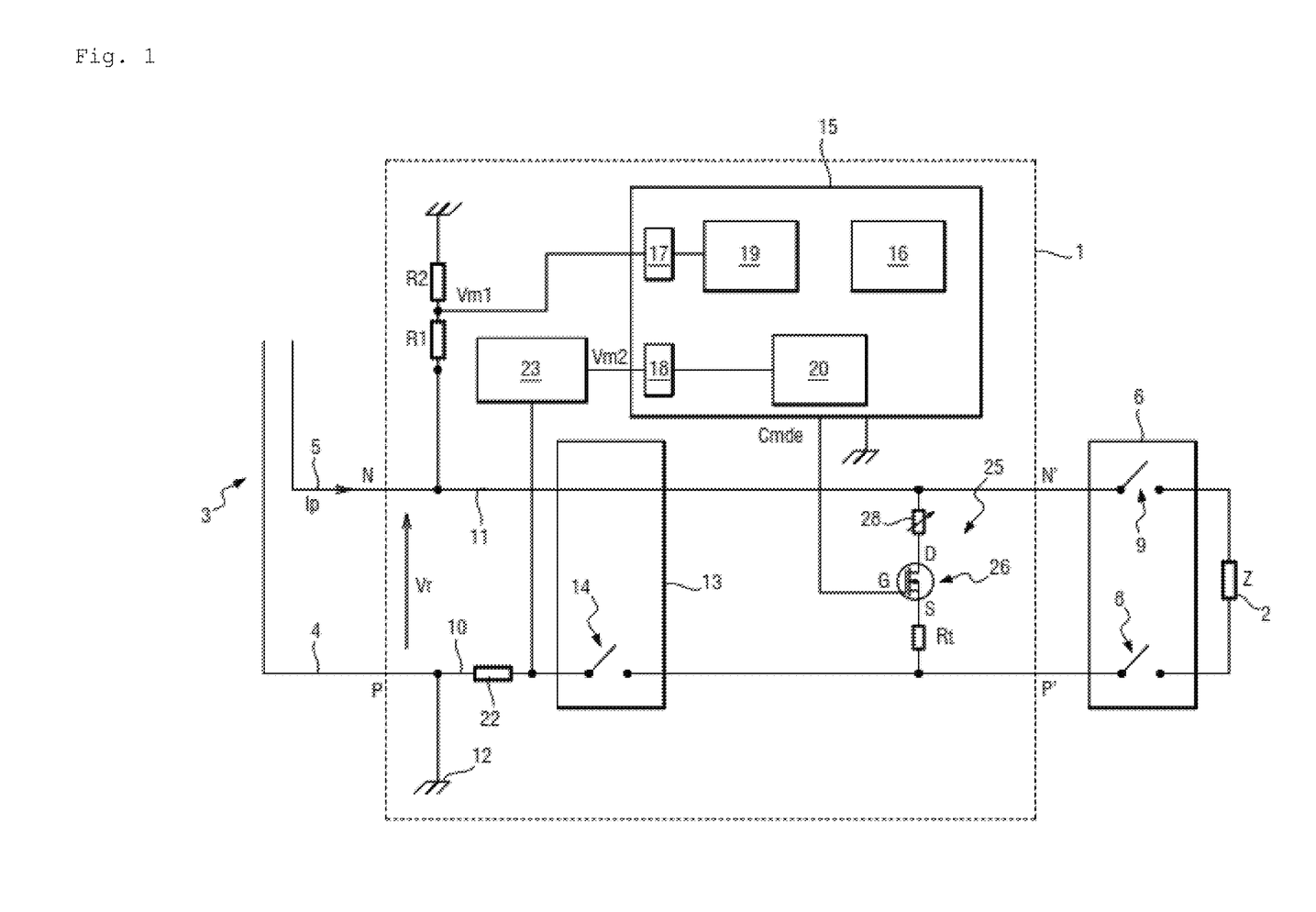
FIG. 1 shows an electricity meter in a first embodiment of the invention, the electricity meter being a single-phase meter.

With reference to FIG. 1, the electricity meter 1 in a first embodiment of the invention is a single-phase meter for measuring the consumption of energy supplied to a subscriber's electrical installation 2 by a distribution network 3. The electrical installation 2 is symbolized by a load Z.

The distribution network 3 comprises a phase line 4 and a neutral line 5.

A circuit breaker 6 is positioned between the meter 1 and the installation 2. The circuit breaker 6 (which can be operated by the subscriber) serves in particular to protect the installation 2 by opening in the event of a surge current occurring in the distribution network 3, e.g. as a result of a short-circuit downstream from the circuit breaker 6.

The meter 1 has an upstream phase port P connected to the phase line 4 and an upstream neutral port N connected to the neutral line 5. The meter 1 also has a downstream phase port P' and a downstream neutral port N'.

In this example, the term "upstream" means on the side of the distribution network 3, and the term "downstream"

means on the side of the installation 2. The downstream phase port P' and the downstream neutral port N' of the meter 1 are connected to the installation 2 via respective switches 8 and 9 that are both incorporated in the circuit breaker 6.

The meter 1 also has a phase conductor 10 connected to the phase line 4 of the distribution network 3 via the upstream phase port P and a neutral conductor 11 connected to the neutral line 5 via the upstream neutral port N. The meter 1 has electrical ground 12 connected to the phase conductor 10 in the proximity of the upstream phase port P.

The meter 1 also includes a cut-off member 13 comprising a switch 14 connected in the phase conductor 10. The cut-off member 13 is used in particular for remotely interrupting or re-establishing the supply of power to the installation 2, e.g. in the event of the subscription being cancelled or of the subscription contract not being complied with.

The meter 1 also has metrological components.

The metrological components comprise a processor component, specifically a metrological microcontroller 15, having the primary function of producing measurements of a certain number of parameters that enable the electricity consumption of the installation 2 to be evaluated. The microcontroller 15 produces measurements of the phase current Ip flowing in the phase line 4 of the distribution network 3, of the network voltage Vr between the phase line 4 and the neutral line 5 of the distribution network 3 (and thus in this example between the electrical ground 12 of the meter 1 and the neutral conductor 11), together with measurements of the power and the energy consumed by the installation 2. The root mean square (RMS) value of the network voltage Vr is theoretically equal to 230 volts (V).

The microcontroller 15 is also adapted to execute instructions of a program for performing the method described below for evaluating measurement error. The program is stored in a memory 16 that is integrated in or connected to the microcontroller 15.

The microcontroller 15 incorporates a first analog-to-digital converter (ADC) 17, a second ADC 18, a voltage measurement module 19, and a current measurement module 20.

The metrological components also include a voltage divider bridge comprising a first measurement resistor R1 and a second measurement resistor R2. The first measurement resistor R1 has a first terminal connected to the neutral conductor 11. The second measurement resistor R2 has a first terminal connected to electrical ground 12. The second terminals of the first and second measurement resistors R1 and R2 are connected together and to an input of the microcontroller 15 that is also connected to an input of the first ADC 17.

The voltage Vm1 that is measured by the first ADC 17 is an image of the network voltage Vr.

The level of the voltage Vm1 is adapted (by means of the divider bridge R1, R2) so as to avoid saturating the first ADC 17, and so as to apply signals to the input of the first ADC 17 that are at levels that are meaningful (corresponding to the input range of the first ADC 17).

The first ADC 17 thus digitizes the voltage Vm1. On the basis of the samples produced by the first ADC 17, the voltage measurement module 19 produces measurements of the RMS value of the network voltage Vr.

The metrological components also include a current sensor, specifically a shunt 22, connected in the phase conductor 10 upstream from the cut-off member 13, and associated with a current measurement circuit 23 presenting known gain. The current measurement circuit 23 is connected to a terminal of the shunt 22, downstream therefrom. The voltage across the terminals of the shunt 22 is thus applied as input to the current measurement circuit 23.

The output of the current measurement circuit 23 is connected to an input of the microcontroller 15 that has a second ADC 18 connected thereto.

The voltage Vm2 at the output from the current measurement circuit 23 is an image of the phase current Ip.

The level of the voltage Vm2 is adapted (by means of the gain of the current measurement circuit 23) so as to avoid saturating the second ADC 18, and so as to apply signals to the input of the second ADC 18 that are at levels that are meaningful (corresponding to the input range of the second ADC 18).

The second ADC 18 digitizes the voltage Vm2. From the samples produced by the second ADC 18, the current measurement module 20 produces measurements of the phase current Ip.

The meter 1 also has a test circuit 25 comprising a test component and a connection component.

In this example, the test component is a test resistor Rt having a first terminal connected to a first conductor selected from the phase conductor 10 and the neutral conductor 11. In this example, the first conductor is the phase conductor 10.

The connection component functions as a switch. Specifically, the connection component is a metal oxide on silicon field effect transistor (MOSFET) 26. The transistor 26 has a first terminal connected to a second terminal of the test resistor Rt, and a second terminal connected to a second conductor selected from the phase conductor 10 and the neutral conductor 11. The second conductor is the neutral conductor 11.

The first terminal of the transistor 26 is its source S and the second terminal of the transistor 26 is its drain D.

The third terminal of the transistor 26, i.e. its gate G, is connected to an output of the microcontroller 15.

The microcontroller 15 can control the transistor by producing a command Cmde that it applies to the gate G of the transistor 26.

The transistor 26 is controllable so as to be conductive or nonconductive, and it can thus put the test resistor Rt selectively in a connected configuration or a disconnected configuration. In the connected configuration, the test resistor Rt is connected to the phase conductor 10 and to the neutral conductor 11 in parallel with the installation 2, so as to form an additional load that is added to the load Z of the installation 2. In the disconnected configuration, the test resistor Rt is disconnected from the phase conductor 10 and/or the neutral conductor 11 (in this example from the neutral conductor 11).

The transistor 26, which is normally nonconductive, is controlled by the command Cmde from the microcontroller 15. If the command Cmde has a high voltage level, then the transistor 26 is conductive. If the command Cmde has a low voltage level, then the transistor 26 is nonconductive.

Figure 2:
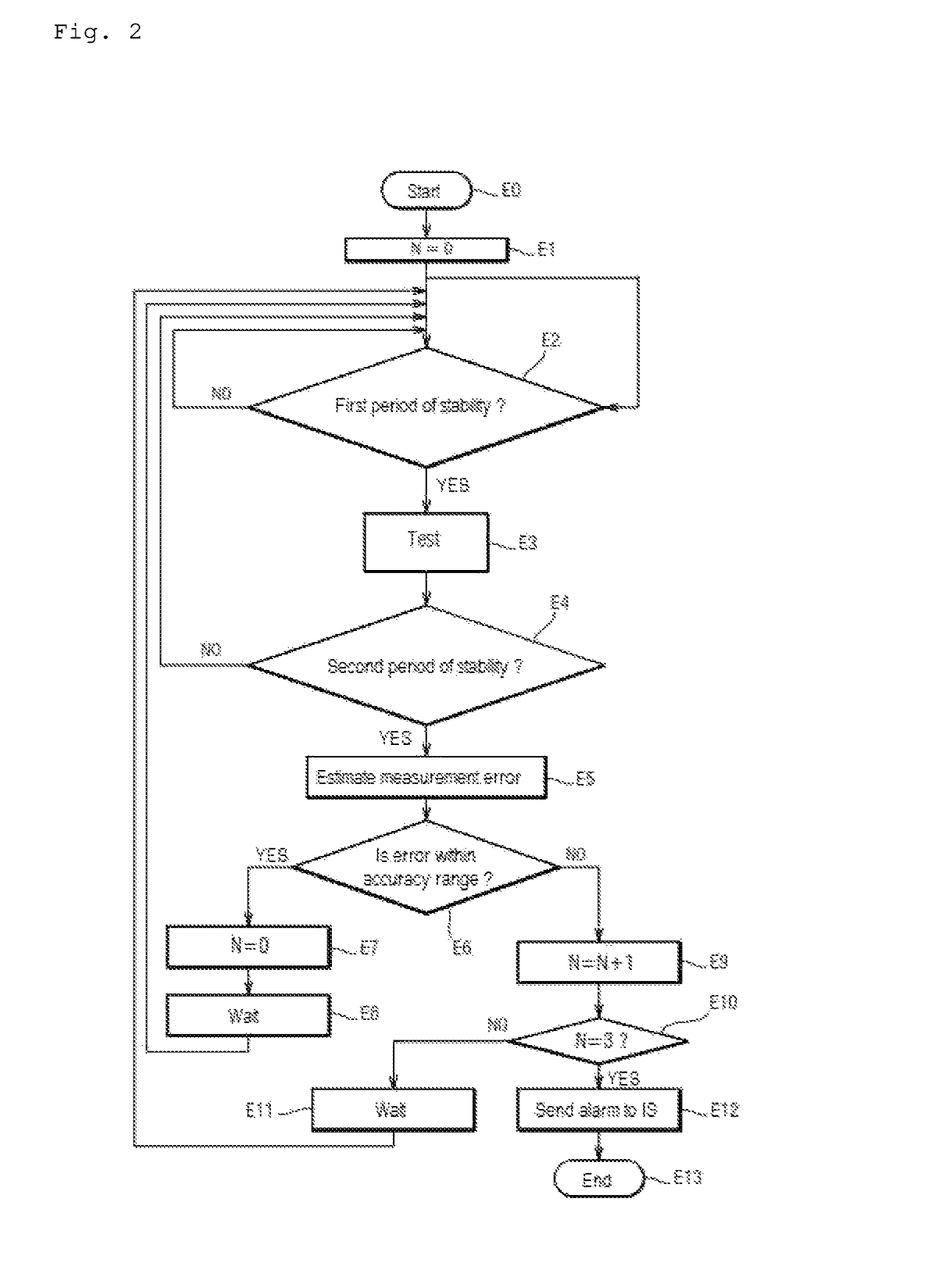
FIG. 2 shows steps of a method of evaluating the measurement error of the meter.

With reference to FIG. 2, there follows a description of how the meter 1 estimates measurement error.

The evaluation method, as performed by the microcontroller 15, begins with step E0.

A variable N is also initialized to 0 (step E1). The variable N serves to count the number of successive occasions on which the accuracy error is measured as lying outside a specified acceptable range.

The method moves on to step E2. The microcontroller 15 attempts to detect a first period of stability both for energy consumption and for network voltage Vr and having a first predetermined duration.

In this example, the first predetermined duration is equal to three (consecutive) seconds.

The microcontroller 15 thus attempts to detect a three-second period during which both energy consumption and network voltage Vr are stable. In this example, a magnitude is said to be "stable over a period" providing the magnitude varies by no more than ±0.1% during said period.

So long as a first period of complete stability has not been detected, the method remains at step E2.

If a first period of stability is detected, then at the end of the first period of stability, i.e. at the beginning of the fourth second following the beginning of the first period of stability, the microcontroller 15 controls the transistor 26 so as to put the test resistor Rt in its connected configuration for a predetermined test duration (step E3).

In this example, the predetermined test duration is equal to 1 second (s).

The microcontroller 15 then measures the total energy consumed over the predetermined test duration.

The total energy Et is such that:

$$Et = E + Ec.$$

where E corresponds to the "base" energy consumption, i.e. the stable level as measured during the first period of stability. Ec is the surplus energy that is consumed during the predetermined test duration and that is due to the additional load (the test resistor Rt).

The microcontroller 15 verifies that the network voltage Vr is stable during the fourth second (i.e. the predetermined test duration).

The microcontroller 15 also verifies that the predetermined test duration is immediately followed by a second period of stability both for energy consumption and for network voltage Vr (step E4) and having a second predetermined duration. The second predetermined duration is equal to three (consecutive) seconds.

The microcontroller 15 thus verifies that energy consumption is stable (once again equal to E, specifically with tolerance of ±0.1%) and that the network voltage Vr is stable over seconds 5, 6, and 7 and is equal to the voltage Vr as measured over seconds 1, 2, and 3, specifically with tolerance of ±0.1%.

This verification serves to confirm that the "base" energy consumed during the fourth second and ignoring the surplus energy continued to be equal to E, and that the network voltage Vr remained stable at the same voltage before, during, and after the measurement.

If microcontroller 15 does not detect a second period of stability, then the method returns to step E2; the measurement taken in step E3 is not taken into account.

In contrast, if a second period of stability is indeed detected, the microcontroller 15 estimates the measurement error of the meter 1 from the surplus energy (step E5).

The measurement error is estimated as follows.

The microcontroller 15 estimates the surplus energy due to the additional load:

$$Ec = Et - E.$$

The microcontroller 15 compares the surplus energy with an expected value. Nevertheless, this expected value depends on the network voltage Vr that is actually present (and possibly slightly different from 230 V).

Calibration is performed in the factory, thereby serving to produce a reference value for the surplus energy $EC_{ref}$. For this purpose, the value of the current passing through the test resistor Rt under 230 V is measured, which value depends on the exact resistance of the test resistor Rt, and the surplus energy consumed by the test resistor Rt during is under 230 V is deduced therefrom. The reference value for the surplus energy $EC_{ref}$ is pre-recorded and stored in a factory calibration parameter stored in the memory 16.

This value is obtained during calibration for a network voltage Vr that is exactly equal to 230 V.

In order to calculate measurement error in operation, the microcontroller 15 calculates an ideal value for the surplus energy $Ec_{ideal}$, which corresponds to the surplus energy as obtained with perfect accuracy. The ideal value for the surplus energy $Ec_{ideal}$ consists in calculating the reference value for the surplus energy at the "actual" RMS value of the network voltage Vr as follows:

$$Ec_{ideal} = EC_{ref} \times V_{RMS}/230;$$

where $V_{RMS}$ is the RMS value of the network voltage Vr.

The microcontroller 15 then estimates measurement error by using the following formula:

$$\text{Error} = Ec - Ec_{ideal}/Ec_{ideal}.$$

The microcontroller 15 then verifies whether the measurement error lies in the required accuracy range (step E6).

If so, the variable N is reinitialized to 0 (step E7).

The method then moves to a waiting step (step E8), e.g. having a duration of 24 hours (h), after which it returns to step E2.

If the measurement error found in step E6 does not lie in the required accuracy range, then the variable N is incremented (step E9).

The microcontroller 15 then compares the value of N with a predefined implementation threshold, which is equal to 3 in this example (step E10).

If N is not equal to 3, then the method moves to a waiting step (step E11), e.g. having a duration of 24 h, after which it returns to step E2.

When N becomes equal to 3, the microcontroller 15 produces an alarm message that is sent by the meter 1 to the IS of the energy distributor (step E12).

The method comes to an end (step E13).

Thus, a measurement error anomaly needs to be detected on three consecutive occasions in order to cause an alarm message to be sent.

It should be observed that the surplus energy Ec consumed during the fourth second is not taken into account when calculating the cumulative energy consumption used for billing the subscriber.

The resistance of the test resistor Rt is calibrated in the factory and its characteristics are accurately known. In this example, the resistance of the test resistor Rt is selected to be equal to 4.7 kilohms (kΩ), thereby having the consequence of adding a current of about 50 milliamps (mA) when the transistor 26 is conductive.

The theoretical current added by such a test resistor is specifically equal to 230 V/4.7 kΩ=48.936 mA.

In this example, the measurement error is estimated at low current (about 1 amp (A)): the periods of stability thus correspond to periods during which the phase current Ip is low.

It should be observed that the test circuit 25 also has a thermistor 28 connected between the transistor 26 and the neutral conductor 11. More precisely, the drain D of the transistor 26 is connected to the neutral conductor 11 via the thermistor 28. The thermistor 28 is of the positive temperature coefficient (ptc) type.

The thermistor 28 makes it possible to comply with safety requirements.

It is possible that a failure might keep the transistor 26 permanently conductive. By way of example, such a failure could apply to the command Cmde from the microcontroller 15, or it could be a failure of the transistor 26 itself. Under such circumstances, current flows continuously through the test resistor Rt, thereby tending to increase its temperature, possibly in a manner that is problematic for the other components of the meter 1.

The thermistor 28 is located in the proximity of the test resistor Rt, such that in the event of a failure occurring that keeps the transistor 26 permanently conductive, the resulting resistance between the phase conductor 10 and the neutral conductor 11 increases with increasing temperature of the test resistor Rt.

The thermistor 28 is selected so as to present a resistance that is (almost) zero at ambient temperature.

Thus, if the transistor 26 is held permanently conductive, the abnormal rise in the temperature of the test resistor Rt also increases the resistance of the thermistor 28, and does so in significant manner, thereby reducing the current flowing through the test resistor Rt (and thus reducing its heating).

Figure 3:
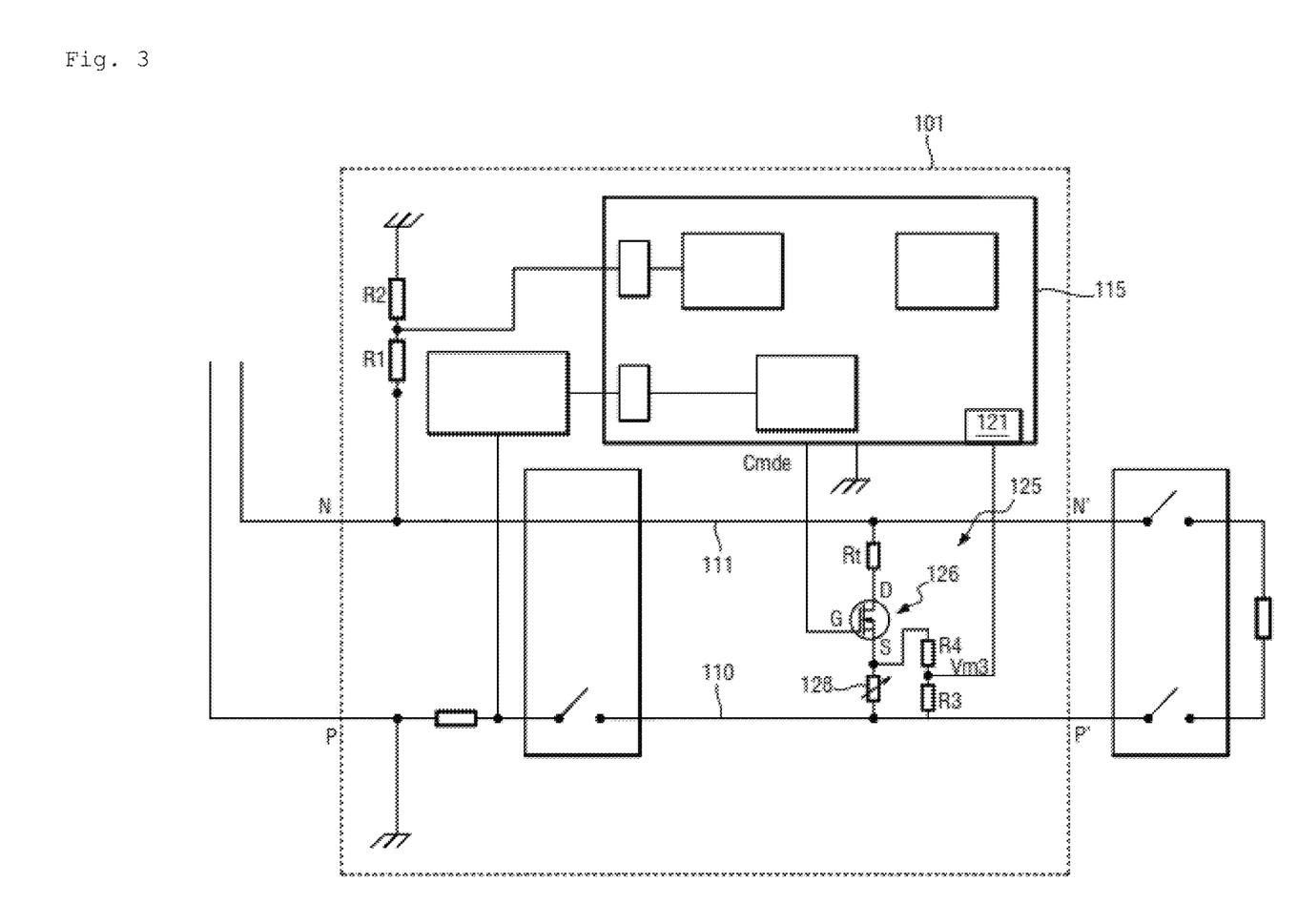
FIG. 3 shows an electricity meter in a second embodiment of the invention, the electricity meter being a single-phase meter.

With reference to FIG. 3, there follows a description of an electricity meter 101 in a second embodiment of the invention.

Once again, the meter 101 is a single-phase meter.

This time, The test resistor Rt has a first terminal connected to the neutral conductor 111.

The transistor 126 has a first terminal connected to a second terminal of the test resistor Rt, and a second terminal connected to the neutral conductor 111. The first terminal of the transistor 126 is its source S and the second terminal of the transistor 126 is its drain D. Once again, the transistor 126 is controlled by the microcontroller 115, which produces a command Cmde on the gate G of the transistor 126.

The thermistor 128 is connected between the transistor 126 and the phase conductor 110. More precisely, the source S of the transistor 126 is connected to the phase conductor 110 via the thermistor 128

The test circuit 125 also has monitoring components serving to monitor that the connection component, i.e. the transistor 126, has responded correctly to the command Cmde reduced by the microcontroller 115.

The monitoring components comprise a third ADC 121 incorporated in the microcontroller 115, a first monitoring resistor R3 having a first terminal connected to the phase conductor 110, and a second monitoring resistor R4 having a first terminal connected to the source S of the transistor 126. The second terminals of the first and second monitoring resistors R3 and R4 are connected together and to an input of the microcontroller 115 that is also connected to an input of the third ADC 121.

In this example, the first monitoring resistor R3 has the same resistance as the second measurement resistor R2 and the second monitoring resistor R4 has the same resistance as the first measurement resistor R1.

The first monitoring resistor R3 and the second monitoring resistor R4 form a voltage divider bridge.

The voltage divider bridge R3, R4 serves to produce a voltage Vm3 that is an image of the voltage present on the source S of the transistor 126.

The voltage divider bridge R3, R4 serves to obtain a voltage Vm3 at an acceptable level at the input to the third ADC 121.

The monitoring components serve to verify that the command Cmde on the gate G transistor 126 is indeed effective. The monitoring components serve in particular to verify that the current flowing through the test resistor Rt is zero when the microcontroller 115 has controlled the transistor 126 so as to put the test resistor Rt in the disconnected configuration.

Specifically, when the microcontroller 115 sends a command to open the transistor 126 (which switches to the nonconductive state), the voltage Vm3 read by the third ADC 121 is normally equal to 0 V in the absence of any anomaly in the command Cmde applied to the transistor 126.

If the third ADC 121 reads a significant monitoring voltage, that means that the test resistor Rt has become heated, thereby increasing the resistance of the thermistor 128, and thus that a significant current is flowing in the test resistor Rt even though that would not be happening if the command Cmde had indeed caused the transistor 126 to open. There is thus a failure having an impact on the demand Cmde applied to the transistor 126.

Thus, prior to performing the method for evaluating measurement error, the microcontroller 115 uses the monitoring components to verify that the command Cmde applied to the transistor 126 is operating correctly.

In order to perform this verification, the microcontroller 115 produces a command Cmde at a low voltage level that is supposed to cause the transistor 126 to take up the nonconductive state. The microcontroller 115 then compares the voltage Vm3 measured by the third ADC 121 with a predefined monitoring threshold, and it detects a failure of the command Cmde if the voltage Vm3 is greater than the predefined monitoring threshold.

The method of evaluating measurement error is performed only if the microcontroller 115 does not detect a failure of the command Cmde. If the microcontroller 115 detects a failure, the microcontroller 115 produces an alarm message that is sent by the meter 101 to the IS of the energy distributor.

Figure 4:
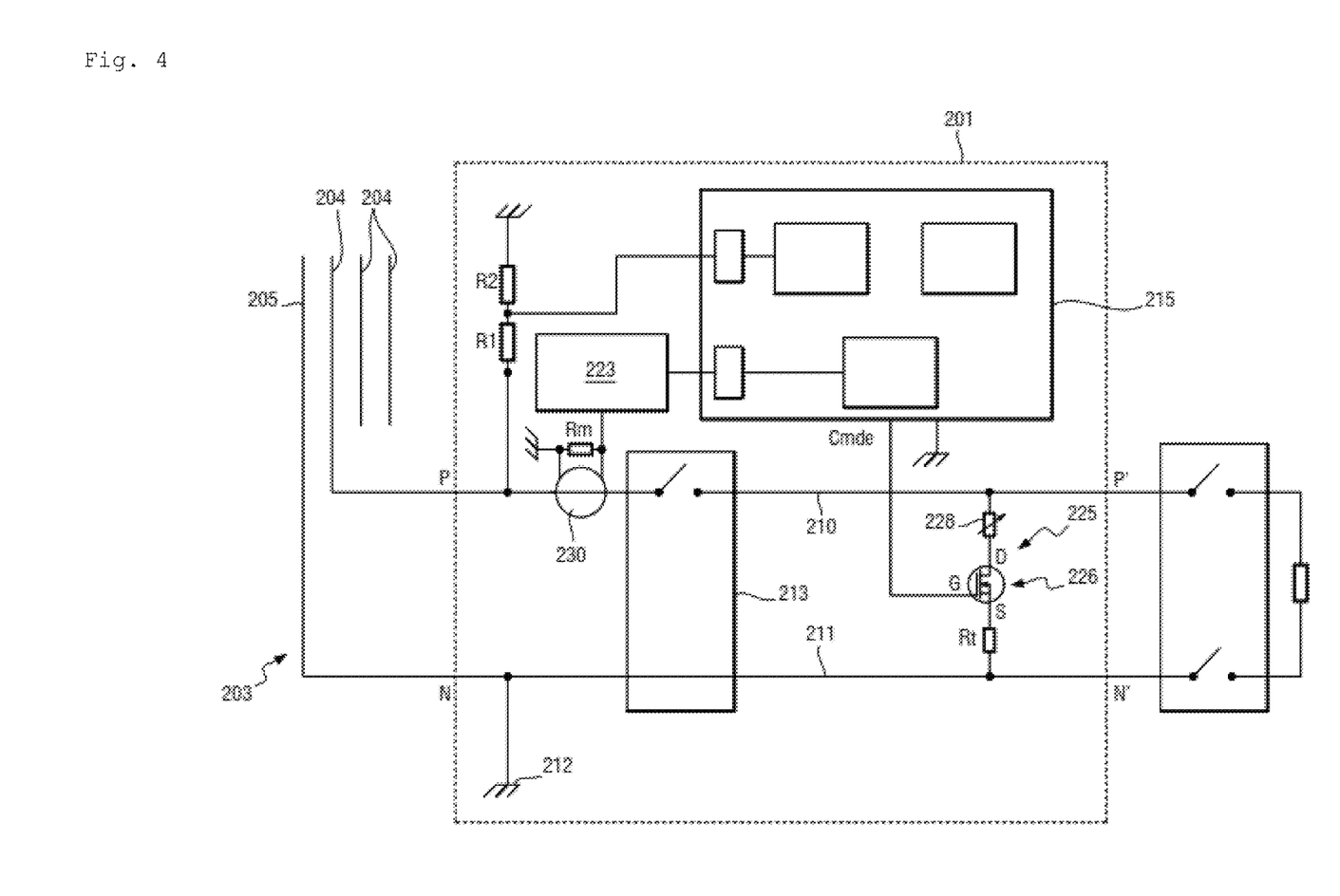
FIG. 4 shows an electricity meter in a third embodiment of the invention, the electricity meter being a three-phase meter.

With reference to FIG. 4, there follows a description of an electricity meter 201 in a third embodiment of the invention.

The meter 201 is a three-phase meter.

The meter 201 has a plurality of phase conductors 210, each connected to a respective one of the phases 204 of the distribution network of 203.

A distinct test circuit 225 is associated with each of the phases 204 of the distribution network 203.

Each test circuit 225 has a test component and a connection component, specifically a test resistor Rt and a transistor 226.

In this example, the test resistor Rt has a first terminal connected to the neutral conductor 211.

The transistor 226 has a first terminal connected to a second terminal of the test resistor Rt, and a second terminal connected to the neutral conductor 211. The first terminal of the transistor 226 is its source S and the second terminal of the transistor 226 is its drain D. The transistor 226 is controlled by the microcontroller 215, which produces a command Cmde on the gate G of the transistor 226.

The thermistor 228 is connected between the transistor 226 and the phase conductor 210. More precisely, the drain D of the transistor 226 is connected to the neutral conductor 211 via the thermistor 228.

This time, the current sensor is not a shunt, but a torus 230 mounted on the phase conductor 210 upstream from the cut-off member 213. A measurement resistor Rm is connected across the output terminals of the torus 230. The current measurement circuit 223 is connected to one of the terminals of the measurement resistor Rm, with the other terminal of the measurement resistor Rm being connected to the electrical ground and 212 of the meter 201.

For each of the phases 204, the measurement error is estimated in the same manner as for the meters 1 and 101.

It should be observed that measurement error is preferably estimated for each of the phases 204 one after another, and not simultaneously. In order to apply the commands Cmde, the microcontroller 215 consequently preferably includes three distinct outputs, each connected to the gate G of the transistor 226 of a respective one of the test circuits 225.

Figure 5:
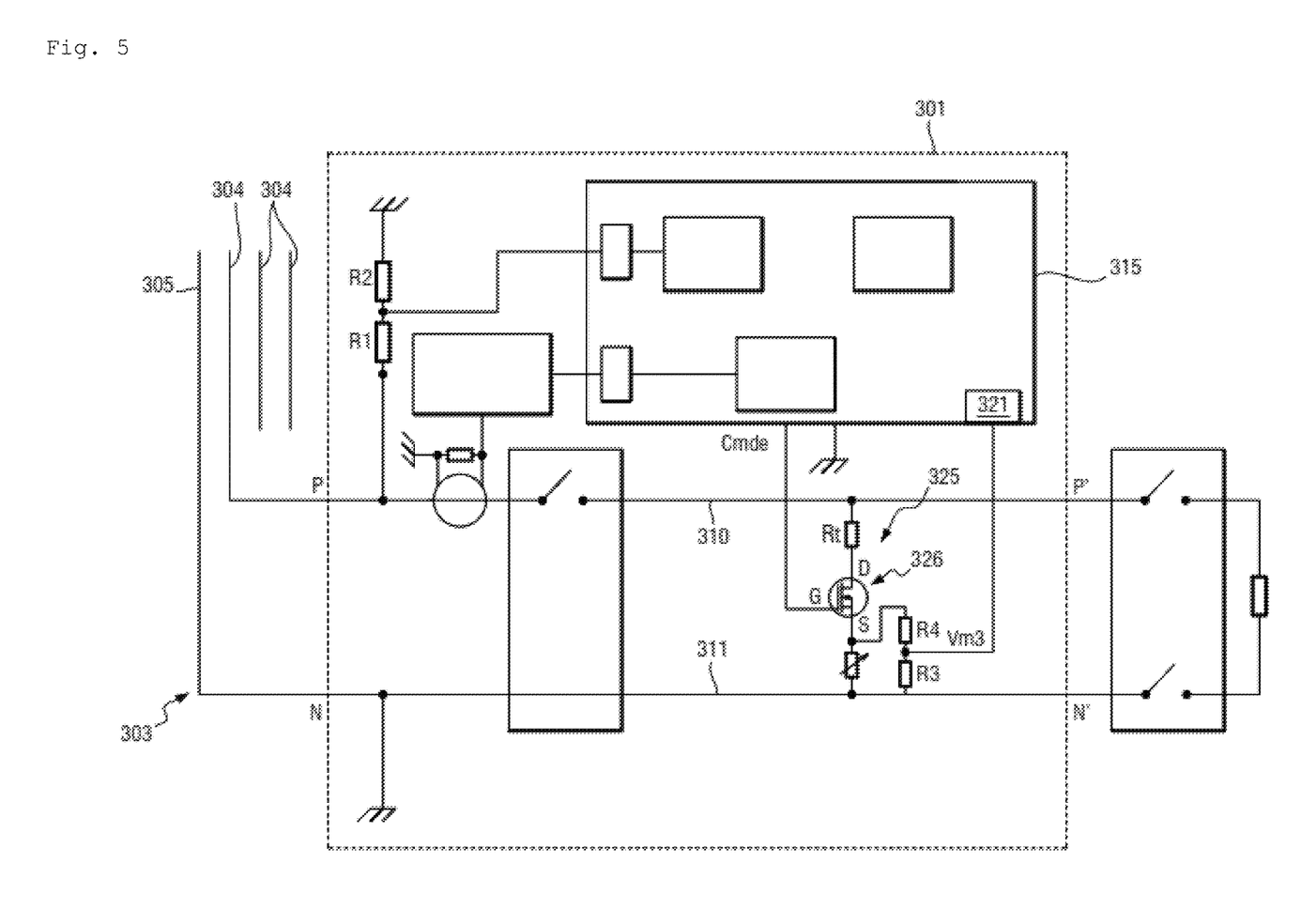
FIG. 5 shows an electricity meter in a fourth embodiment of the invention, the electricity meter being a three-phase meter.

Advantageously, and with reference to FIG. 5, each phase 304 of the distribution network 303 to which the three-phase meter 301 is connected is associated with a respective test circuit 325 that also includes monitoring components similar to those of FIG. 3.

The monitoring components serve to monitor that the connection component, i.e. transistor 326, has responded correctly to the command Cmde produced by the microcontroller 315.

Once again, the monitoring components comprise a third ADC 321 incorporated in the microcontroller 315, a first monitoring resistor R3 having a first terminal connected to the phase conductor 311, and a second monitoring resistor R4 having a first terminal connected to the source S of the transistor 326. The second terminals of the first and second monitoring resistors R3 and R4 are connected together and to an input of the microcontroller 315 that is also connected to an input of the third ADC 321.

In like manner, the second monitoring resistor R4 has the same resistance as the first measurement resistor R1 and the first monitoring resistor R3 has the same resistance as the second measurement resistor R2.

As mentioned above, measurement error is estimated with low current. Nevertheless, and regardless of the kind of meter (single-phase, three-phase), it is possible to evaluate measurement error regardless of the level of the current phase Ip.

Thus, for each phase, the meter may have at least first and second respective test circuits associated with said phase, the microcontroller evaluating measurement error by using the first test circuit when the phase current Ip flowing in the phase conductor connected to said phase is less than a predefined current threshold, and using the second test circuit when the phase current is greater than the predefined current threshold.

In particular, the meter may have three test circuits per phase: a first test circuit is dedicated to reforming verification at low current (about 1 A) and includes a test resistor Rt, a second test circuit is dedicated to verifying at medium current (5 A to 20 A) and includes a test resistor Rmedium, and a third test circuit is dedicated to reforming verification at high current (greater than 40 A) and includes a test resistor Rhigh. The test resistors Rt, Rmedium, and Rhigh may potentially have different acceptable maximum powers.

For each phase, the meter thus includes three test circuits, each having a test resistor, a transistor, and a thermistor, with the microcontroller generating three separate commands Cmde.

The microcontroller then makes use of two predefined current thresholds in order to select which test circuit is to be used. The first current threshold, serving to select between the first test circuit and the second test circuit, may lie for example in the range 2 A to 4 A, the second current threshold, serving to select between the second test circuit and the third test circuit, may lie for example in the range 25 A to 35 A.

Each of the above-described meters also includes a temperature sensor that measures ambient temperature inside the meter box.

The measurements produced by the temperature sensor may be used for estimating the temperature of the test resistor Rt. The microcontroller knows how the resistance of the test resistor Rt varies as a function of temperature (a curve provided by the supplier).

The microcontroller can thus acquire the measurements of ambient temperature as produced by the temperature sensor, and then estimate a temperature-corrected value for the resistance of the test resistor from those measurements, and it can use said temperature-corrected resistance to improve the accuracy with which the surplus energy is measured, and thus the accuracy with which the measurement error of the meter is measured.

Advantageously, the method of evaluating the measurement error of the meter is performed at night, when ambient temperature is usually lower, thereby ensuring that the heating of the test resistor during the test is small.

Naturally, the invention is not limited to the embodiments described, but covers any variant coming within the ambit of the invention as defined by the claims.

The invention can be implemented with an electricity meter that is single-phase, or indeed multi-phase and connected to an arbitrary number of phases.

The architecture of the meter could naturally be different from that described above.

Two or three ADCs are described as being incorporated in the microcontroller. Nevertheless, it is possible to make use of a single ADC incorporated in the microcontroller. The microcontroller would then have a first input connected to the voltage divider bridge R1, R2 of the metrological components, a second input connected to the current measurement circuit, and possibly a third input connected to the voltage divider bridge R3, R4 of the monitoring components.

These inputs of the microcontroller are connected to the ADC, which incorporates a multiplexer having (at least) two or three inputs connected respectively to the first input, to the second input, and possibly to the third input, and also an output connected to the converter core of the ADC.

The one or more ADCs may also be external to the microcontroller.

The microcontroller in which the invention is performed need not necessarily be the metrological microcontroller, but could be a distinct component.

The processor component in which the invention is performed need not necessarily be a microcontroller, but it could be some other component, for example it could be a conventional processor, a digital signal processor (DSP), or indeed a programmable logic circuit such as a field programmable gate array (FPGA) or an application specific integrated circuit (ASIC).

The test component need not necessarily be a (single) resistor, but could comprise one or more arbitrary components suitable for forming an additional load (capacitor, inductor, etc.). The connection component could be any type of component capable of putting the test component in a connected configuration or in a disconnected configuration (for example it could be some other type of transistor).

The processor component and the connection component could be a single component.

The invention claimed is:

1. An electricity meter arranged to measure consumption of energy supplied to an installation by a distribution network comprising a phase line and a neutral line, the electricity meter comprising:

a phase conductor and a neutral conductor arranged to be connected respectively to the phase line and to the neutral line;

a test circuit comprising a test component and a connection component arranged to place the test component selectively in a connected configuration, in which the test component is connected to the phase conductor and to the neutral conductor in parallel with the installation so as to form an additional load, and a disconnected configuration in which the test component is disconnected from the phase conductor and/or from the neutral conductor;

a processor component arranged to control the connection component in such a manner that it places the test component in the connected configuration during a predetermined test duration, to measure surplus energy consumed during the predetermined test duration and due to the additional load, and to estimate measurement error of the electricity meter from the surplus energy.

2. The electricity meter according to claim 1, wherein the processor component is arranged to attempt to detect stability both in energy consumption and in network voltage between the phase line and the neutral line over a first period of stability having a first predetermined duration, and in order to control the connection component in such a manner as to place the test component in the connected configuration only after the first period of stability has been detected.

3. The electricity meter according to claim 2, wherein the processor component is arranged to verify that the predetermined test duration is followed by stability both in energy consumption and in network voltage over a second period of stability having a second duration, and to estimate the measurement error only if the second period of stability is detected.

4. The electricity meter according to claim 1, wherein the processor component is arranged to measure network voltage, to calculate an ideal value for the surplus energy by relating a pre-recorded reference value for the surplus energy to the network voltage, and to estimate the measurement error from the surplus energy and from the ideal value for the surplus energy.

5. The electricity meter according to claim 1, wherein the test component has a first terminal connected to a first conductor selected from the phase conductor and the neutral conductor, and wherein the connection component has a switch function and comprises a first terminal connected to a second terminal of the test component and a second terminal connected to a second conductor selected from the phase conductor and the neutral conductor.

6. The electricity meter according to claim 5, wherein the second terminal of the connection component is connected to the second conductor via a thermistor such that in the event of a failure occurring that causes the connection component to be maintained continuously conductive, a resistance that results between the phase conductor and the neutral conductor increases with increasing temperature of the test component.

7. The electricity meter according to claim 1, further comprising monitoring components arranged to verify that current flowing in the test component is zero when the processor component has controlled the connection component so that it places the test component of the disconnected configuration.

8. The electricity meter according to claim 6, wherein the monitoring components comprise an analog-to-digital converter and a voltage divider bridge arranged to produce a voltage that is an image of the voltage present at the second terminal of the connection component.

9. The electricity meter according to claim 1, further including a temperature sensor arranged to measure ambient temperature inside the meter, the processor component being arranged to acquire measurements of the ambient temperature, to estimate a temperature-corrected value for the test component and to use said temperature-corrected value so as to improve the accuracy with which the surplus energy is measured, and thus improve accuracy with which the measurement error of the electricity meter is estimated.

10. The electricity meter according to claim 1, comprising at least a first test circuit and a second test circuit associated with said phase line, the processor component being arranged to evaluate the measurement error of the electricity meter by using the first test circuit when phase current flowing in the phase line is less than a predefined current threshold, and using the second test circuit when the phase current is greater than the predefined current threshold.

11. The electricity meter according to claim 1, the electricity meter being a multi-phase meter and the distribution network having a plurality of phase lines, the electricity meter having at least one respective test circuit associated with each phase line.

12. The electricity meter according to claim 1, the test component being a resistor.

13. The electricity meter according to claim 1, the connection component being a MOSFET.

14. The electricity meter according to claim 1, wherein the processor component is also arranged to measure phase current flowing in the phase line, network voltage between the phase line and the neutral line, and energy consumption by the installation.

15. A method of evaluating the measurement error of the electricity meter according to claim 1, the method comprising the steps of:

controlling the connection component so that it places the test component in the connected configuration during a predetermined test duration;

during the predetermined test duration, measuring the surplus energy consumption due to the additional load;

evaluating the measurement error of the electricity meter from the surplus energy.

16. The method of evaluating the measurement error according to claim 15, further comprising a step of detecting a first period of stability both in energy consumption and in network voltage between the phase line and the neutral line, and to place the test component in the connected configuration only after a first period of stability has been detected.

17. The method of evaluating the measurement error according to claim 16, further comprising, after the predetermined test duration, the step of attempting to detect a second period of stability both in energy consumption and also in network voltage, and of estimating the measurement error only if the second period of stability is detected.

18. The method of evaluating the measurement error according to claim 15, further comprising the step of verifying whether the measurement error lies within a required accuracy range, of incrementing a variable if it does not, and then repeating the preceding steps, and producing an alarm when the variable becomes equal to a predefined incrementation threshold.

19. A non-transitory computer-readable storage medium storing a computer program including instructions that cause the processor component of the electricity meter according to claim 1 to execute a method of evaluating the measurement error of the electricity meter, the method comprising the steps of:
- controlling the connection component so that it places the test component in the connected configuration during a predetermined test duration;
- during the predetermined test duration, measuring the surplus energy consumption due to the additional load;
- evaluating the measurement error of the electricity meter from the surplus energy.

* * * * *